United States Patent
Morris et al.

(10) Patent No.: US 10,283,480 B2
(45) Date of Patent: *May 7, 2019

(54) SUBSTRATE STRUCTURE WITH SELECTIVE SURFACE FINISHES FOR FLIP CHIP ASSEMBLY

(71) Applicant: Qorvo US, Inc., Greensboro, NC (US)

(72) Inventors: Thomas Scott Morris, Lewisville, NC (US); Robert Hartmann, Apopka, FL (US)

(73) Assignee: Qorvo US, Inc., Greensboro, NC (US)

( * ) Notice: Subject to any disclaimer, the term of this patent is extended or adjusted under 35 U.S.C. 154(b) by 197 days.

This patent is subject to a terminal disclaimer.

(21) Appl. No.: 15/225,389

(22) Filed: Aug. 1, 2016

(65) Prior Publication Data

US 2017/0040276 A1    Feb. 9, 2017

Related U.S. Application Data

(60) Provisional application No. 62/201,863, filed on Aug. 6, 2015.

(51) Int. Cl.
  *H01L 23/00* (2006.01)
  *H01L 23/31* (2006.01)
  *H01L 23/498* (2006.01)

(52) U.S. Cl.
  CPC .......... *H01L 24/81* (2013.01); *H01L 23/3121* (2013.01); *H01L 23/49811* (2013.01);
  (Continued)

(58) Field of Classification Search
  CPC ......... H01L 24/81; H01L 24/05; H01L 24/03; H01L 24/16; H01L 23/49811; H01L 23/3121; H01L 24/17; H01L 24/14; H01L 2224/81913; H01L 2224/81911; H01L 2224/8149; H01L 2224/1403;
  (Continued)

(56) References Cited

U.S. PATENT DOCUMENTS

| 7,928,574 B2 * | 4/2011 | Abbott | H01L 23/498 257/762 |
| 2003/0117775 A1 * | 6/2003 | Vrtis | H01L 23/3735 361/705 |

(Continued)

OTHER PUBLICATIONS

Author Unknown, "Section 1: Solder Reflow Basics," Solder Reflow Technology Handbook, Research International, Date Unknown, 6 pages.

*Primary Examiner* — Tucker J Wright
*Assistant Examiner* — Thai T Vuong
(74) *Attorney, Agent, or Firm* — Withrow & Terranova, P.L.L.C.

(57) ABSTRACT

The present disclosure relates to a substrate structure with selective surface finishes used in flip chip assembly, and a process for making the same. The disclosed substrate structure includes a substrate body, a metal structure with a first finish area and a second finish area, a first surface finish, and a second surface finish. The metal structure is formed on a top surface of the substrate body, the first surface finish is formed over the first finish area of the metal structure, and the second surface finish is formed over the second finish area of the metal structure. The first surface finish is different from the second surface finish.

20 Claims, 9 Drawing Sheets

(52) U.S. Cl.
CPC .............. *H01L 24/14* (2013.01); *H01L 24/17* (2013.01); *H01L 24/13* (2013.01); *H01L 24/16* (2013.01); *H01L 2224/13082* (2013.01); *H01L 2224/13101* (2013.01); *H01L 2224/13147* (2013.01); *H01L 2224/1403* (2013.01); *H01L 2224/16225* (2013.01); *H01L 2224/8121* (2013.01); *H01L 2224/8149* (2013.01); *H01L 2224/81143* (2013.01); *H01L 2224/81444* (2013.01); *H01L 2224/81815* (2013.01); *H01L 2224/81911* (2013.01); *H01L 2224/81913* (2013.01); *H01L 2224/81914* (2013.01); *H01L 2924/181* (2013.01)

(58) Field of Classification Search
CPC . H01L 2224/13101; H01L 2224/13082; H01L 2224/13147; H01L 2224/81914; H01L 24/13; H01L 2224/81444; H01L 2224/16225; H01L 2924/181

USPC ........................................................ 257/766
See application file for complete search history.

(56) References Cited

U.S. PATENT DOCUMENTS

| | | | | |
|---|---|---|---|---|
| 2010/0276787 A1* | 11/2010 | Yu | ....................... | H01L 21/6836 257/621 |
| 2010/0288541 A1* | 11/2010 | Appelt | ................... | H01L 21/486 174/257 |
| 2010/0320610 A1* | 12/2010 | Huang | .................. | H01L 21/486 257/773 |
| 2014/0027893 A1* | 1/2014 | Chou | ..................... | H05K 1/112 257/676 |
| 2014/0042621 A1* | 2/2014 | Yu | ............................ | H01L 24/05 257/738 |
| 2014/0231127 A1* | 8/2014 | Manero | .................. | H05K 3/243 174/266 |

* cited by examiner

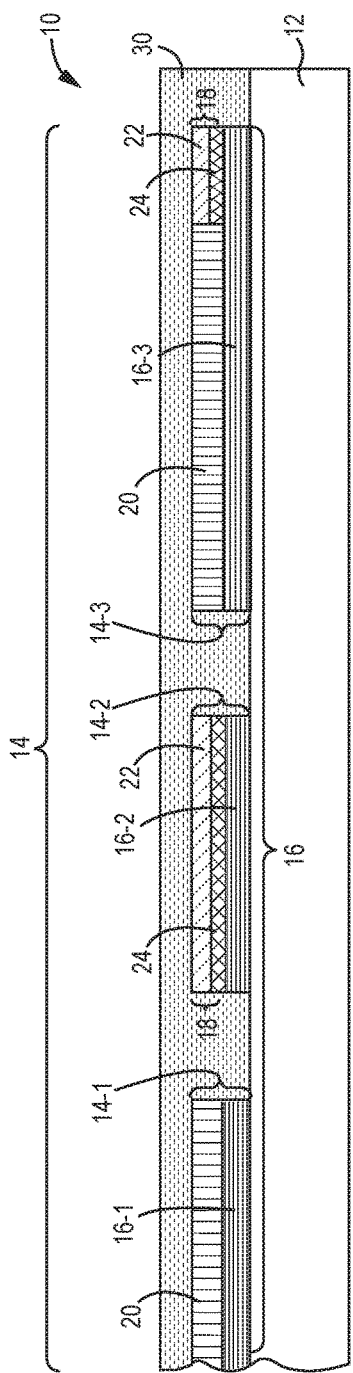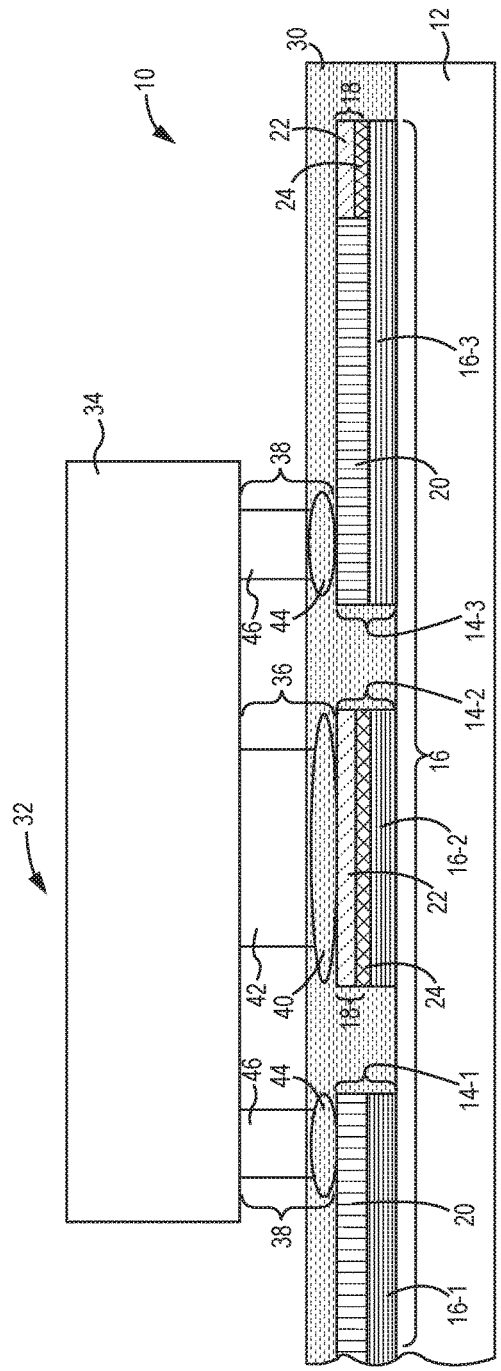

SUBSTRATE STRUCTURE WITH SELECTIVE SURFACE FINISHES FOR FLIP CHIP ASSEMBLY

RELATED APPLICATIONS

This application claims the benefit of U.S. provisional patent application No. 62/201,863, filed Aug. 6, 2015, the disclosure of which is incorporated herein by reference in its entirety.

FIELD OF THE DISCLOSURE

The present disclosure relates to a substrate structure and a process for making the same, and more particularly to a substrate structure with selective surface finishes for flip chip assembly, and a process to form selective surface finishes over the substrate structure.

BACKGROUND

Flip chip assembly technology is widely utilized in semiconductor packaging due to its short interconnect paths between flip chip dies and a substrate, which eliminates the space needed for wire bonding and thus reduces the overall size of the package. In addition, the elimination of wire bonds reduces undesired parasitic inductance, thereby making the package configuration attractive for high-frequency applications.

In general, a flip chip die has a die body and multiple interconnect structures that are used to attach the flip chip die to the substrate. Each interconnect structure includes a solder and a pillar extending outward from the die body to the solder. In flip chip assembly, reflowing solders of the interconnect structures is one of the process steps used to connect each interconnect structure to a corresponding metal structure on a top surface of the substrate. Due to cost and performance considerations, the pillar of each interconnect structure and the corresponding metal structure are formed of copper. During the reflowing step, the solder of each interconnect structure will turn into a liquid-phase and flow along the most active surface. Since the pillar and the corresponding metal structure are formed from a common material—copper, there is a risk that the liquid phase solder will flow back to the flip chip die along the pillar and short circuits on the flip chip die.

To address this issue, a surface finish is applied to the metal structure to increase its surface activity. One possible surface finish formed of gold will effectively pull the liquid-phase solder onto the metal structure and prevent the liquid-phase solder from flowing up the pillar back to the flip chip die. Normally, applying the gold surface finish to the metal structure is provided by electrolytic plating, which requires bus bars around the metal structure for routing electrical potential and current during the plating process. However, these bus bars will significantly increase the size of the package. In addition, the gold surface finish is expensive, which will raise the cost of the final product.

Accordingly, there remains a need for improved substrate structure designs to reduce the possibility of the solder flowing back to the flip chip die and without significantly increasing the package size. Further, there is also a need to keep the final product cost effective.

SUMMARY

The present disclosure relates to a substrate structure with selective surface finishes for flip chip assembly, and a process for making the same. The disclosed substrate structure includes a substrate body, a metal structure with a first finish area and a second finish area, a first surface finish, and a second surface finish. The metal structure is formed on a top surface of the substrate body, the first surface finish is formed over the first finish area of the metal structure, and the second surface finish is formed over the second finish area of the metal structure. The first surface finish is different from the second surface finish. Both the first and second surface finishes increase the surface activity of the metal structure.

According to an exemplary process to fabricate a substrate structure with selective surface finishes, a substrate body and a metal structure formed on a top surface of the substrate body are provided initially, where the metal structure has a first finish area and a second finish area. A patterned mask layer is then formed over the metal structure to expose the first finish area of the metal structure and cover the second finish area of the metal structure. Next, a first surface finish is formed over the first finish area of the metal structure. Then the patterned mask layer is removed to expose the second finish area of the metal structure. Finally, a second surface finish is formed over the second finish area of the metal structure. The second surface finish is different from the first surface finish.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 5A-5D provide exemplary fabrication steps that illustrate a process to attach a flip chip die to the exemplary substrate structure shown in FIG. 1B.

Figure 1A:
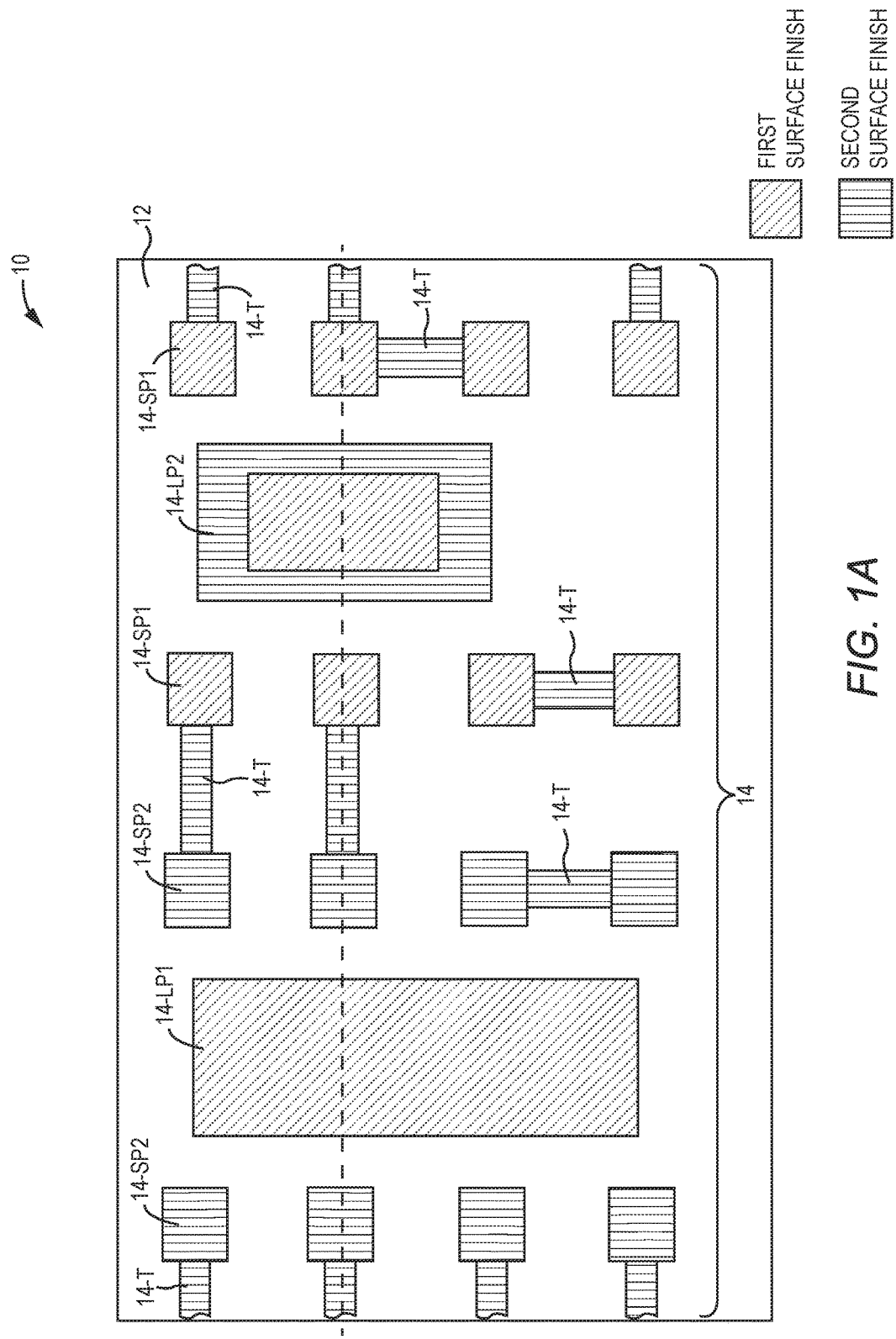
FIGS. 1A-1B provide an exemplary substrate structure with selective surface finishes according to one embodiment of the present disclosure.

It will be understood that for clear illustrations, FIGS. 1A-5D may not be drawn to scale.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1A is a top view of an exemplary substrate structure 10 according to one embodiment of the present disclosure. The substrate structure 10 includes a substrate body 12 and finished metal structures 14 over a top surface of the substrate body 12. For the purpose of this illustration, the finished metal structures 14 include eight first surface finished small pads 14-SP1, eight second surface finished small pads 14-SP2, one first surface finished large pad 14-LP1, one combined surface finished large pad 14-LP2, and twelve second surface finished traces 14-T (only a few of the pads and traces are labeled with reference numbers to avoid drawing clutter). In different applications, the finished metal structures 14 may include fewer or more small pads/large pads/traces with different surface finishes. Further, the finished metal structures 14 may have different shapes for small pads/large pads/traces.

Figure 1B:
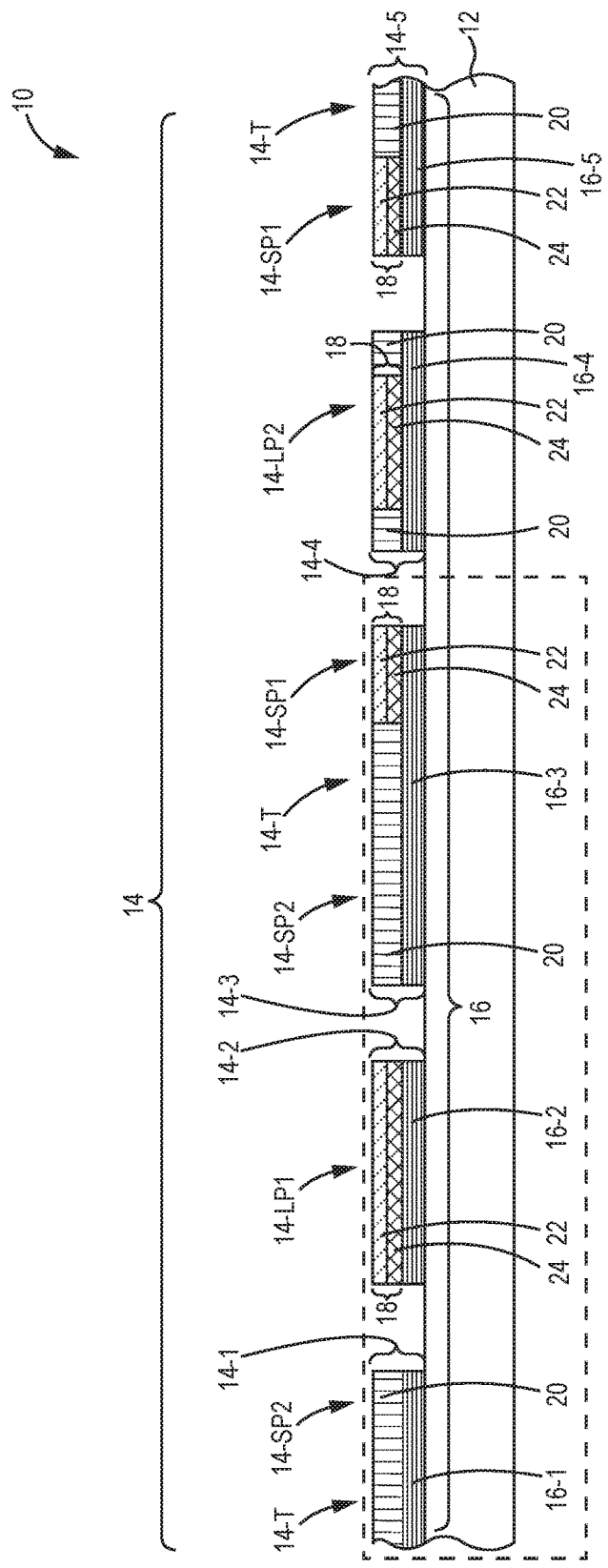

FIG. 1B shows a cross-sectional view of the exemplary substrate structure 10 at the dashed-line in FIG. 1A. The finished metal structures 14 are formed by metal structures 16 with a first surface finish 18 and a second surface finish 20. The metal structures 16 may be formed of copper, which has a relatively low surface activity. A thickness of the metal structures 16 is between 6 µm and 26 µm. The first surface finish 18 and the second surface finish 20 formed over the metal structures 16 help to increase the surface activity of the finished metal structures 14, and consequently help to pull the liquid-phase solders onto the finished metal structures 14 in a later reflowing process.

In general, the first surface finish 18 is different from the second surface finish 20. By definition, materials are different if they include different elements or have a different element composition. The first surface finish 18 has a higher surface activity than the second surface finish 20. Consequently, portions of the finished metal structures 14 with the first surface finish 18 will more effectively pull the liquid-phase solders in a later reflowing process than portions of the finished metal structures 14 with the second surface finish 20. However, the first surface finish 18 is normally more expensive than the second surface finish 20. For cost and performance considerations, the first surface finish 18 is applied to selective metal structures 16, which are configured to receive important wirebonds or interconnect structures of a die; while the second surface finish 20 is applied to the other metal structures 16, which are configured to receive less important interconnect structures of a die or conductive traces. In different applications, the first and second surface finishes 18 and 20 may be applied to different portions of the metal structures 16.

In one embodiment, the first surface finish 18 may include gold, which has a much higher surface activity compared to copper. One exemplary material used to form the first surface finish 18 is electroless palladium immersion gold (EPIG) finish, which includes a first layer 22 formed of gold with a thickness between 0.06 µm and 0.14 µm, and a second layer 24 formed of palladium with a thickness between 0.08 µm and 0.16 µm. The second layer 24 resides over the selective metal structures 16 and the first layer 22 resides over the second layer 24. The second surface finish 20 does not include gold and may be formed from an organic surface protectorant (OSP) with a thickness between 0.2 µm and 0.4 µm, such as SOLDERITE WPF-207 and COPPERGUARD #177 from Tamura Co. The first surface finish 18 may have a same or different thickness as the second surface finish 20.

As illustrated in FIG. 1B, a first finished metal structure 14-1 includes a first metal structure 16-1 over the top surface of the substrate body 12 and the second surface finish 20 over the first metal structure 16-1, corresponding to one of the second surface finished small pads 14-SP2 and one of the second surface finished traces 14-T. A second finished metal structure 14-2 includes a second metal structure 16-2 over the top surface of the substrate body 12 and the first surface finish 18 over the second metal structure 16-2, corresponding to the first surface finished large pad 14-LP1.

In one embodiment, a third finished metal structure 14-3 includes a third metal structure 16-3 over the top surface of the substrate body 12, the first surface finish 18 covering a first finish area of the third metal structure 16-3, and a second surface finish 20 covering a second finish area of the third metal structure 16-3. Herein, the first finish area of the third metal structure 16-3 covered by the first surface finish 18 corresponds to one of the first surface finished small pads 14-SP1; and the second finish area of the third metal structure 16-3 covered by the second surface finish 20 corresponds to one of the second surface finished small pads 14-SP2 and one of the second surface finished traces 14-T.

In one embodiment, a fourth finished metal structure 14-4 includes a fourth metal structure 16-4 over the top surface of the substrate body 12, the first surface finish 18 covering a first finish area of the fourth metal structure 16-4, and the second surface finish 20 covering second finish areas of the fourth metal structure 16-4. Herein, the first finish area of the fourth metal structure 16-4 covered by the first surface finish 18 corresponds to a first portion of the combined surface finished large pad 14-LP2; and the second finish areas of the fourth metal structure 16-4 covered by the second surface finish 20 correspond to second portions of the combined surface finished large pad 14-LP2.

Similar to the third finished metal structure 14-3, a fifth finished metal structure 14-5 includes a fifth metal structure 16-5 over the top surface of the substrate body 12, the first surface finish 18 covering a first finish area of the fifth metal structure 16-5, and the second surface finish 20 covering a second finish area of the fifth metal structure 16-5. Herein, the first finish area of the fifth metal structure 16-5 covered by the first surface finish 18 corresponds to one of the first surface finished small pads 14-SP1; and the second finish area of the fifth metal structure 16-5 covered by the second surface finish 20 corresponds to one of the second surface finished traces 14-T.

Figure 2:
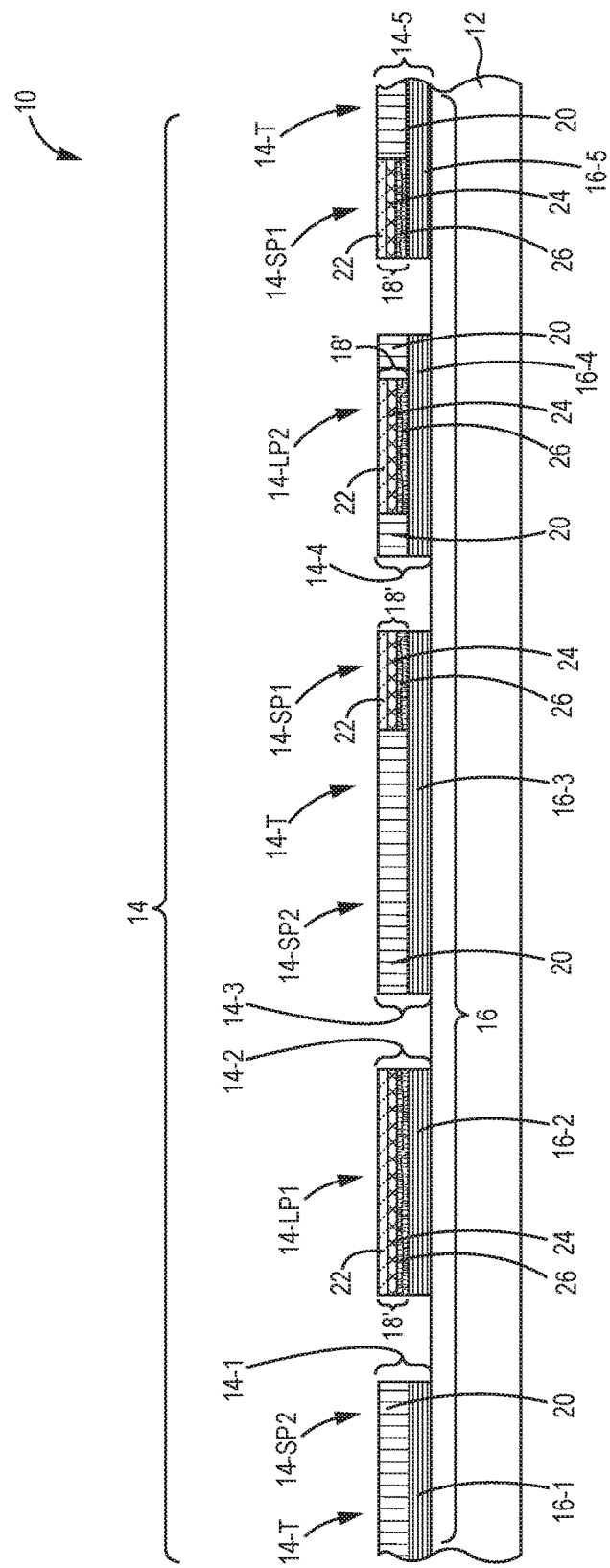
FIG. 2 provides an exemplary substrate structure with selective surface finishes according to one embodiment of the present disclosure.

In some other applications, electroless nickel electroless palladium immersion gold (ENEPIG), bussed nickel gold (NiAu), bussless NiAu, or the like may also be used as a first surface finish. As illustrated in FIG. 2, a first surface finish 18' is formed from ENEPIG, which includes the first layer 22 formed of gold with a thickness between 0.06 μm and 0.14 μm, the second layer 24 formed of palladium with a thickness between 0.08 μm and 0.16 μm, and a third layer 26 formed of nickel with a thickness between 0.3 μm and 0.5 μm. The third layer 26 resides over the selective metal structures 16, the second layer 24 resides over the third layer 26, and the first layer 22 resides over the second layer 24.

FIGS. 3A-3F provide exemplary fabrication steps that illustrate a process to fabricate the substrate structure 10 shown in FIG. 1B. For simplification, only a portion of the substrate structure 10 within section A of FIG. 1B is illustrated. Although the exemplary fabrication steps in FIGS. 3A-3F are illustrated in a sequential order, the exemplary fabrication steps are not necessarily order dependent. Some fabrication steps may be done in a different order than that presented. Further, fewer or more fabrication steps may be done than those illustrated in FIGS. 3A-3F.

Figure 3A:
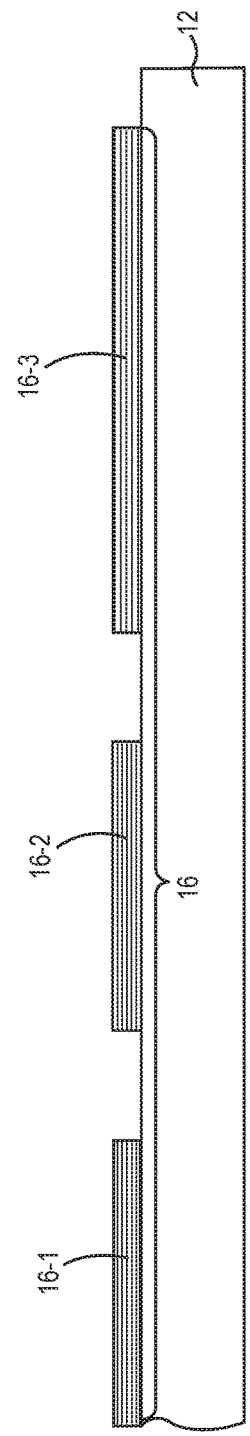
FIGS. 3A-3F provide exemplary fabrication steps that illustrate a process to fabricate the exemplary substrate structure shown in FIG. 1B.
Figure 3B:
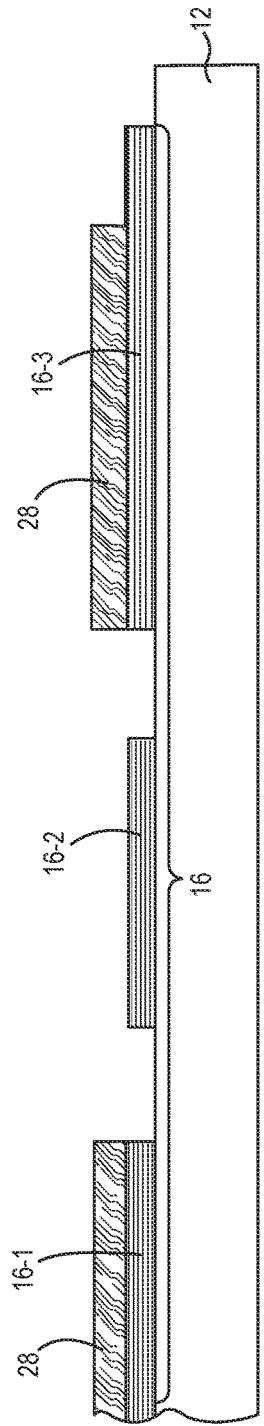

Initially, the substrate body 12 and the metal structures 16 over the top surface of the substrate body 12 are provided as depicted in FIG. 3A. Then, a patterned mask layer 28 is formed over the metal structures 16. In this embodiment, the patterned mask layer 28 covers the first metal structure 16-1 and the second finish area of the third metal structure 16-3 as depicted in FIG. 3B. The patterned mask layer 28 may be formed of Hitachi PHOTEC Photosensitive Film with a thickness between 19 μm and 25 μm. A lamination process may be used to apply the patterned mask layer 28 over the metal structures 16.

Figure 3C:
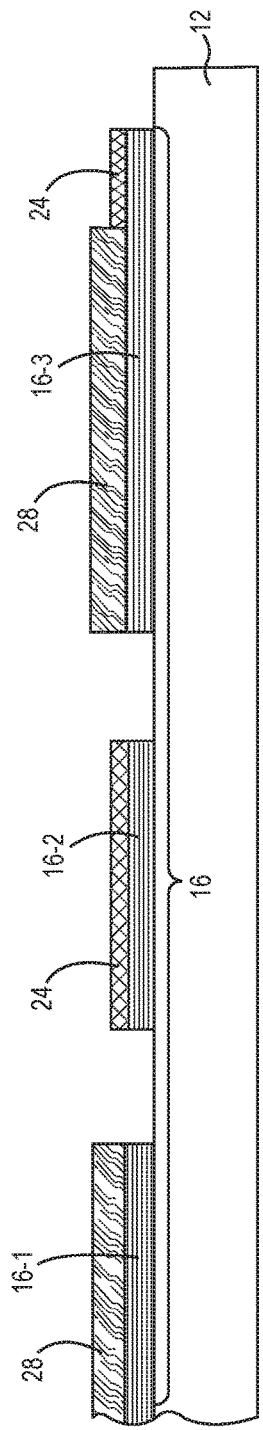
Figure 3D:
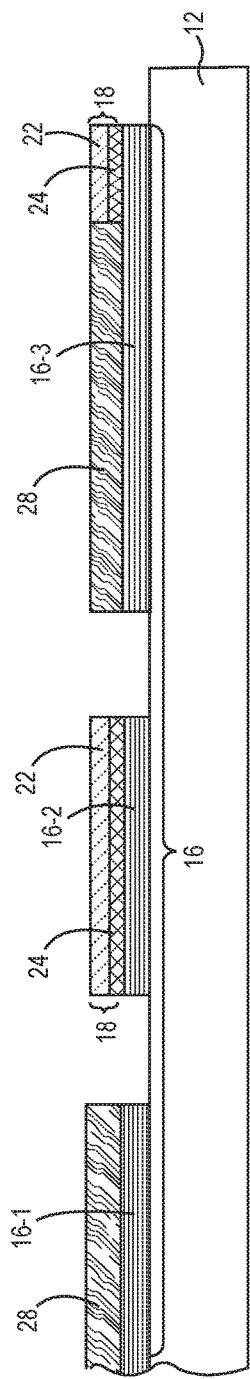

Next, the first surface finish 18 is formed as depicted in FIGS. 3C-3D. The second layer 24 of the first surface finish 18 is formed over portions of the metal structures 16, which are exposed through the patterned mask layer 28. In this embodiment, the second layer 24 of the first surface finish 18 is formed over the second metal structure 16-2 and the first finish area of the third metal structure 16-3. Then the first layer 22 of the first surface finish 18 is formed over the second layer 24 to complete the first surface finish 18. Forming the first surface finish 18 may be provided by an electroless process, which does not require bus bars around the metal structures 16. In one embodiment, the first surface finish 18 is EPIG finish, where the first layer 22 formed of gold is provided by an immersion gold bath and the second layer 24 formed of palladium is provided by an electroless palladium bath.

Clearly, if the first surface finish 18 is ENEPIG finish, a process to form the first surface finish 18 includes an extra step to form the third layer 26 (not shown) before forming the second layer 24 and the first layer 22. Herein, the third layer 26 resides between the portions of the metal structures 16 exposed through the patterned mask layer 28 and the second layer 24. The third layer 26 formed of nickel is provided by an electroless nickel bath.

Figure 3E:
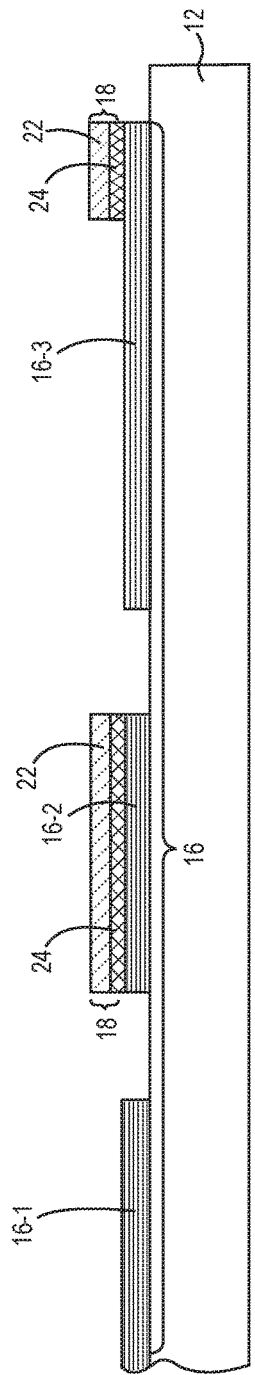
Figure 3F:
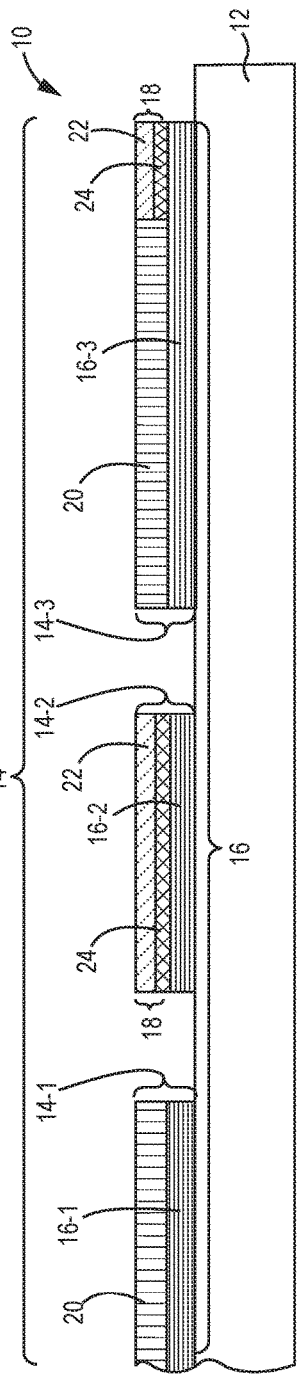

The patterned mask layer 28 is then removed to expose the first metal structure 16-1 and the second finish area of the third metal structure 16-3 as depicted in FIG. 3E. Removing the patterned mask layer 28 may be provided by a stripping process. Finally, the second surface finish 20 is formed over areas where the patterned mask layer 28 has been removed as depicted in FIG. 3F. In this embodiment, the second surface finish 20 is formed over the first metal structure 16-1 and the second finish area of the third metal structure 16-3, such that the substrate structure 10 is formed with the finished metal structures 14. The second surface finish 20 may be formed of an OSP and provided by an inline submersion process, which does not require bus bars around the metal structures 16.

Figure 4:
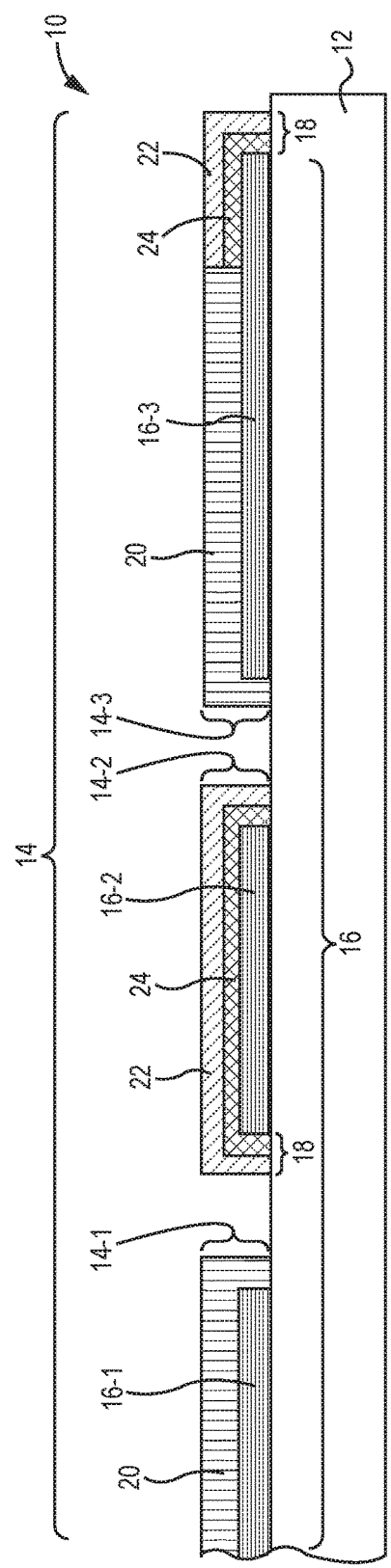
FIG. 4 provides an alternative substrate structure with selective surface finishes according to one embodiment of the present disclosure.

It will be clear to those skilled in the art that it is also possible that the first and second surface finishes 18 and 20 wrap around side surfaces of the metal structures 16 as depicted in FIG. 4. Wrapping around the side surfaces of the metal structures 16 increases active surface areas of the finished metal structures 14, thereby more efficiently pulling the liquid-phase solders onto the finished metal structures 14 in a later reflowing process.

FIGS. 5A-5D provide exemplary fabrication steps that illustrate a process to attach a flip chip die to the exemplary substrate structure 10 shown in FIG. 1B. For simplification, only a portion of the substrate structure 10 within section A of FIG. 1B is illustrated. Although the exemplary fabrication steps in FIGS. 5A-5D are illustrated in a sequential order, the exemplary fabrication steps are not necessarily order dependent. Some fabrication steps may be done in a different order than that presented. Further, fewer or more fabrication steps may be done than those illustrated in FIGS. 5A-5D.

After the substrate structure 10 is formed, a flux material 30 is applied to the top surface of the substrate body 12 and encapsulates the finished metal structures 14 as depicted in FIG. 5A. The flux material 30 may be formed from water soluble materials or other similar formulations. The purpose of the flux material 30 is to promote solder liquefying during the later reflowing process. Without the flux material 30, the solders may not properly turn liquid-phase or adhere to any surface. Applying the flux material 30 may be provided by screening, dipping, or other suitable means.

Next, a flip chip die 32 is placed onto the substrate structure 10 as depicted in FIG. 5B. For the purpose of this illustration, there is only one flip chip die 32 placed onto the substrate structure 10. The flip chip die 32 has a die body 34, a large interconnect structure 36 and two small interconnect structures 38 extending outward from a bottom surface of the die body 34. In different applications, multiple flip chip dies may be placed onto the substrate structure 10, and fewer or more interconnect structures may be included in the flip chip die 32.

In detail, the large interconnect structure 36 includes a large solder cap 40 and a large pillar 42 extending outward from the bottom surface of the die body 34 to the large solder cap 40. Each small interconnect structure 38 includes a small solder cap 44 and a small pillar 46 extending outward from the bottom surface of the die body 34 to the small solder cap 44. The large solder cap 40 is coupled to the second finished metal structure 14-2 through the flux material 30 and the two small solder caps 42 are coupled to the first and third finished metal structures 14-1 and 14-3, respectively, through the flux material 30. Herein, the flux material 30 may encapsulate the large solder cap 40 and the small solder caps 44. The large solder cap 40 is in contact with the first surface finish 18 and the small solder caps 44 are in contact with the second surface finish 20. The large and small solder caps 40 and 44 may be formed of tin; and the large and small pillars 42 and 46 may be formed of copper.

As described above, the first surface finish 18 has a higher surface activity than the second surface finish 20, while the first surface finish 18 is more expensive than the second surface finish 20. For cost and performance considerations, the first surface finish 18 may only be applied to selective metal structures 16, which are configured to receive important wirebonds or interconnect structures of a die; while the second surface finish 20 is applied to the remaining metal structures 16, which are configured to receive less important interconnect structures of a die or conductive traces. It will be clear to those skilled in the art that a large solder cap may have a higher probability to flow back to a flip chip die through a pillar than a small solder cap during the reflowing process. Consequently, in this embodiment, the large solder cap 40 is in contact with the first surface finish 18, while the two small solder caps 44 are in contact with the second surface finish 20.

Figure 5C:
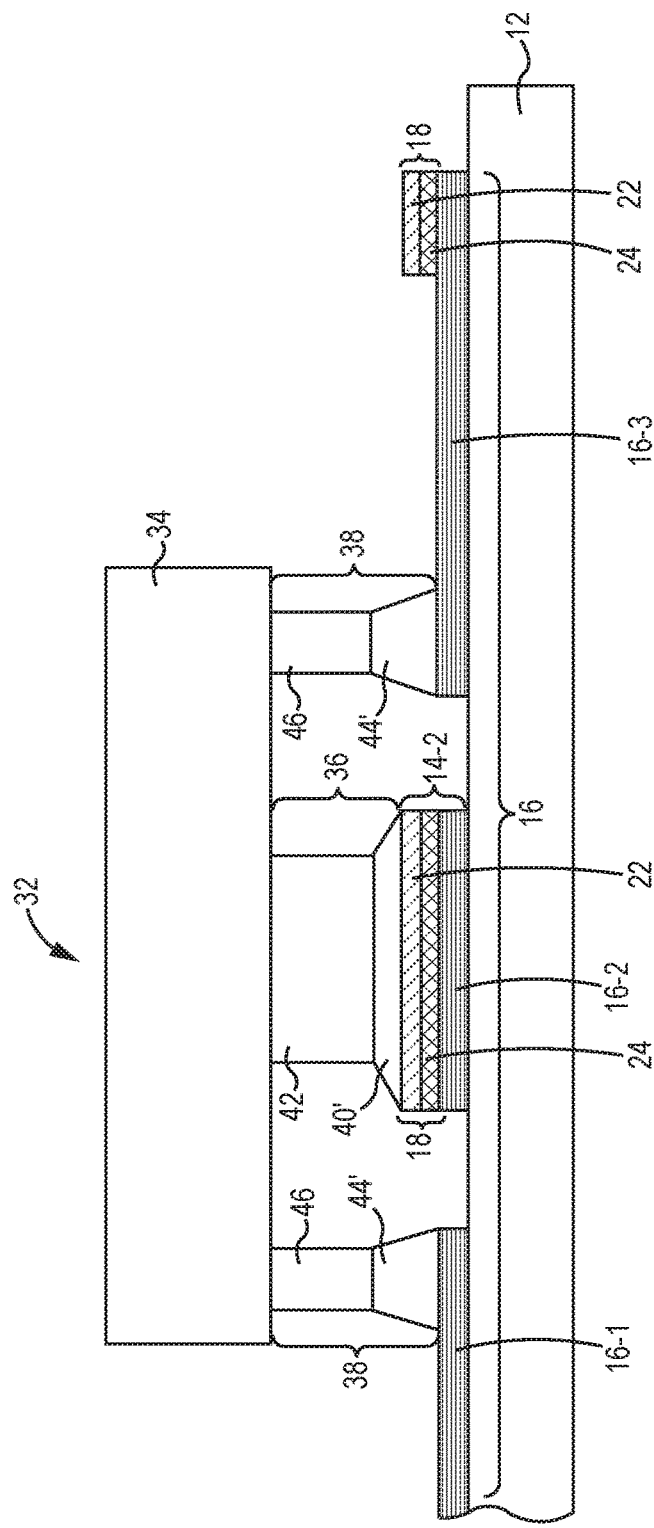

Next, reflowing the large solder cap 40 and the small solder caps 44 within the flux material 30 is followed as depicted in FIG. 5C. During the reflowing process, the large and small solder caps 40 and 44 turn into a liquid-phase and flow along the most active surfaces. Compared to the large pillar 42, the second finished metal structure 14-2 has a higher surface activity due to the first surface finish 18. Thereby, the liquid-phase large solder cap 40 flows along the second finished metal structure 14-2 to form a large solder joint 40'. Similarly, compared to the small pillars 46, the first and third finished metal structures 14-1 and 14-3 have a higher surface activity due to the second surface finish 20. Thereby, the liquid-phase small solder caps 44 will not flow back to the flip chip die 32 along the small pillars 44. The reflowing process may be provided by heating in a furnace between 250° C. and 270° C.

Notice that, in applications where the second surface finish 20 is formed of an OSP, the second surface finish 20 is typically consumed during the reflowing process. Small solder joints 44' formed from the small solder caps 44 are directly in contact with the first and third metal structures 16-1 and 16-3, respectively. In applications where the second surface finish 20 is formed of a material other than an OSP, the second surface finish 20 may remain after the reflowing process. Further, during the reflowing process, the flux material 30 may burn off substantially. A removal process (not shown) may be applied to remove the residue of the flux material 30 after the reflowing process. The removal process may be provided by a saponifier wash process, which is an aqueous process, or a plasma cleaning process, which is a dry process with an Argon-Oxygen mixed gas.

Figure 5D:
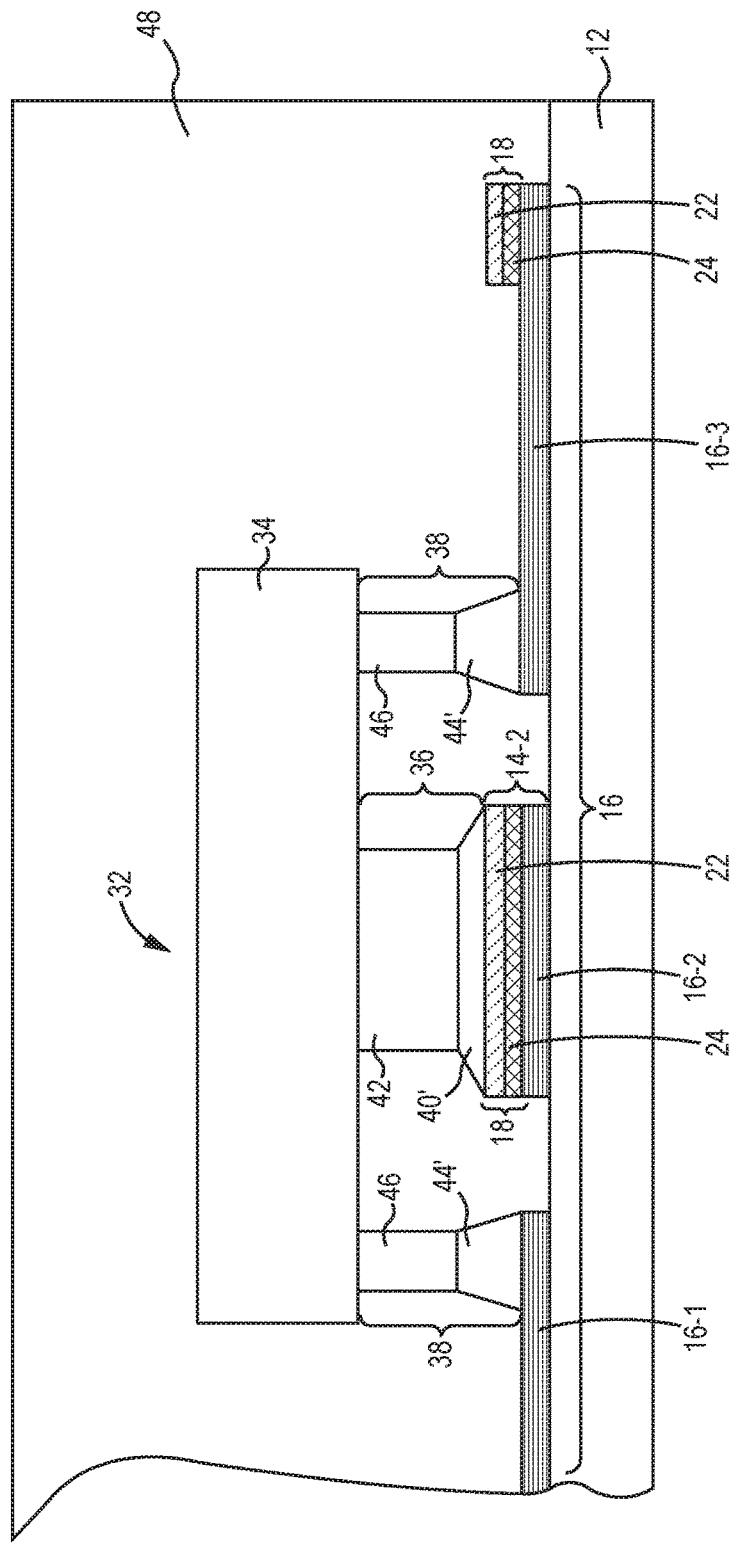

Finally, a mold compound 48 may be formed over the substrate body 12 and encapsulate the flip chip die 32 as depicted in FIG. 5D. The mold compound 48 may be applied by various procedures, such as sheet molding, overmolding, compression molding, transfer molding, dam fill encapsulation, and screen print encapsulation. The mold compound 48 is an organic epoxy resin system or the like, such as Hitachi Chemical Electronic Materials GE-100LFC, which protects the flip chip die 32 against damage from the outside environment.

Those skilled in the art will recognize improvements and modifications to the embodiments of the present disclosure. All such improvements and modifications are considered within the scope of the concepts disclosed herein and the claims that follow.

What is claimed is:

1. An apparatus comprising:
   a substrate body;
   a first metal structure formed on a top surface of the substrate body and having a first finish area and a second finish area, wherein the first finish area of the first metal structure is surrounded by the second finish area of the first metal structure;
   a first surface finish provided over the first finish area of the first metal structure; and
   a second surface finish that is different from the first surface finish and provided over the second finish area of the second metal structure.

2. The apparatus of claim 1 wherein the first surface finish is electroless nickel electroless palladium immersion gold (ENEPIG).

3. The apparatus of claim 2 wherein the first surface finish comprises:
   a first layer formed of gold with a thickness between 0.06 μm and 0.14 μm;
   a second layer formed of palladium with a thickness between 0.08 μm and 0.16 μm; and
   a third layer formed of nickel with a thickness between 0.3 μm and 0.5 μm, wherein the third layer is over the first finish area, the second layer is over the third layer, and the first layer is over the second layer.

4. The apparatus of claim 2 wherein the second surface finish is an organic surface protectorant (OSP).

5. The apparatus of claim 4 wherein a thickness of the second surface finish is between 0.2 μm and 0.4 μm.

6. The apparatus of claim 1 wherein the first surface finish is bussless NiAu or electroless palladium immersion gold (EPIG).

7. The apparatus of claim 1 wherein the first surface finish comprises gold and the second surface finish does not comprise gold.

8. The apparatus of claim 1 wherein the first surface finish is ENEPIG or EPIG, and the second surface finish is an OSP.

9. The apparatus of claim 1 further comprising a second metal structure formed on the top surface of the substrate body, wherein the first surface finish is provided over at least a portion of the second metal structure.

10. The apparatus of claim 9 wherein the first surface finish comprises gold and the second surface finish does not comprise gold.

11. The apparatus of claim 1 further comprising a second metal structure formed on the top surface of the substrate body, wherein the second surface finish is provided over at least a portion of the second metal structure.

12. The apparatus of claim 11 wherein the first surface finish comprises gold and the second surface finish does not comprise gold.

13. The apparatus of claim 1 wherein the first surface finish is a multilayer finish and the second surface finish is a single layer finish.

14. The apparatus of claim 1 wherein the first metal structure is formed of copper.

15. The apparatus of claim 1 wherein a thickness of the first metal structure is between 6 μm and 26 μm.

16. The apparatus of claim 1 further comprising:
a flip chip die having a die body and a first interconnect structure, wherein the first interconnect structure extends outward from the die body and is coupled to the first surface finish on the first metal structure.

17. The apparatus of claim 16 further comprising a second metal structure formed on the top surface of the substrate body, wherein:
at least a portion of the second metal structure is not covered by the first surface finish; and
the flip chip die further includes a second interconnect structure, wherein the second interconnect structure extends outward from the die body and is directly coupled to the second metal structure.

18. The apparatus of claim 1 further comprising a second metal structure that is formed on the top surface of the substrate body and has a first finish area and a second finish area, wherein:
the first surface finish is provided over the first finish area of the second metal structure; and
the second surface finish is provided over the second finish area of the second metal structure.

19. The apparatus of claim 18 wherein the first finish area of the second metal structure corresponds to a pad configured to receive a wirebond or interconnect structure of a die and the second finish area of the second metal structure corresponds to a conductive trace that connects the pad to another pad or via.

20. The apparatus of claim 19 wherein the first surface finish is ENEPIG or EPIG, and the second surface finish is an OSP.

* * * * *